United States Patent
Palmigiani

(10) Patent No.: US 12,407,952 B2
(45) Date of Patent: Sep. 2, 2025

(54) LOW NOISE PIXEL FOR IMAGE SENSOR

(71) Applicant: Commissariat à l'Énergie Atomique et aux Énergies Alternatives, Paris (FR)

(72) Inventor: Gaelle Palmigiani, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 18/509,746

(22) Filed: Nov. 15, 2023

(65) Prior Publication Data

US 2024/0089624 A1 Mar. 14, 2024

Related U.S. Application Data

(62) Division of application No. 17/125,165, filed on Dec. 17, 2020, now Pat. No. 11,863,890.

(30) Foreign Application Priority Data

Dec. 20, 2019 (FR) .................................. 1915093

(51) Int. Cl.
*H04N 25/65* (2023.01)
*H04N 25/771* (2023.01)
*H10F 39/00* (2025.01)

(52) U.S. Cl.
CPC ........... *H04N 25/65* (2023.01); *H04N 25/771* (2023.01); *H10F 39/8037* (2025.01)

(58) Field of Classification Search
CPC ........ H04N 25/60; H04N 25/65; H04N 25/77; H04N 25/771; H01L 27/14612
See application file for complete search history.

(56) References Cited

U.S. PATENT DOCUMENTS

| | | | |
|---|---|---|---|
| 6,940,551 B2 | 9/2005 | Merrill | |
| 8,860,860 B2 * | 10/2014 | Inoue | H04N 25/616 |
| | | | 348/297 |
| 9,917,119 B2 | 3/2018 | Murakami et al. | |
| 2013/0075593 A1 | 3/2013 | Williams, Jr. | |
| 2020/0162688 A1 | 5/2020 | Wang | |
| 2021/0028787 A1 | 1/2021 | Pennock et al. | |
| 2021/0195126 A1 | 6/2021 | Palmigiani | |
| 2021/0351223 A1 | 11/2021 | Nomoto | |

FOREIGN PATENT DOCUMENTS

| | | |
|---|---|---|
| CN | 109327666 A | 2/2019 |
| EP | 1 263 210 A1 | 12/2002 |

OTHER PUBLICATIONS

Preliminary Search Report for French Application No. 1915093, dated Oct. 29, 2020.

* cited by examiner

*Primary Examiner* — Daniel M Pasiewicz
(74) *Attorney, Agent, or Firm* — Wolf, Greenfield & Sacks, P.C.

(57) ABSTRACT

A pixel circuit comprising: a light-sensing element; a first transistor having its control node coupled to a sense node and its source coupled to a readout path of the pixel circuit; and a reset voltage correction circuit comprising: a first switch configured to selectively couple an input node of the reset voltage correction circuit to a correction node, the input node being connected to the sense node or to the source of the first transistor, the correction node being coupled by a capacitance to the sense node; and a second switch configured to selectively couple the correction node to a reset voltage.

10 Claims, 11 Drawing Sheets

LOW NOISE PIXEL FOR IMAGE SENSOR

CROSS REFERENCE TO RELATED APPLICATIONS

This Application is a Division of U.S. application Ser. No. 17/125,165, filed Dec. 17, 2020, entitled "LOW NOISE PIXEL FOR IMAGE SENSOR". Foreign priority benefits are claimed under 35 U.S.C. § 119(a)-(d) or 35 U.S.C. § 365(b) of French application number 1915093, filed Dec. 20, 2019. The entire contents of these applications are incorporated herein by reference in their entirety.

TECHNICAL FIELD

The present disclosure relates generally to the field of image sensors, and in particular to pixel circuits of image sensors and to methods of resetting such pixel circuits.

BACKGROUND ART

Pixels of image sensors generally comprise a photodiode, or other type of photodetector, that generates a current by integrating incident light received from the image scene. During the integration period, this current is drawn from a sense node of the pixel, which thus sees a drop in its voltage, this voltage drop being proportional to the amount of received light.

The voltage at the sense node is generally initialized to a reset voltage level at the start of integration period. However, this reset voltage level contains thermal noise, which is a type of white noise, caused by variations in the ON resistance of the reset transistor that is used to apply the reset voltage to the sense node.

A common solution for reducing this thermal noise is the correlated double sampling (CDS) technique. This involves sampling two voltage levels, a reference level corresponding to the reset voltage level present at the sense node prior to the start of the integration period, and the final pixel voltage present at the sense node at the end of the integration period. By subtracting the final pixel voltage from the reference level, the voltage drop caused by the incident light to be determined. Furthermore, as both of these voltage levels contain the thermal noise component, the thermal noise will be at least partially cancelled by the subtraction.

However, a drawback of the CDS technique is that it leads either to a longer read operation, or to the use of a memory capacitor array outside the image sensor array in order to store the reset voltage levels, or to the use of a pinned photodiode and a transfer gate between the photodiode and the sense node, i.e. a so-called 4T pixel with four transistors.

There is a need in the art for an alternative solution permitting a reduction in the thermal noise while avoiding one or more of the drawbacks of the CDS approach.

SUMMARY OF INVENTION

Embodiments of the present disclosure aim to at least partially address one or more needs in the prior art.

A pixel circuit comprising: a light-sensing element; a first transistor having its control node coupled to a sense node and its source coupled to a readout path of the pixel circuit; and a reset voltage correction circuit comprising: a first switch configured to selectively couple an input node of the reset voltage correction circuit to a correction node, the input node being connected to the sense node or to the source of the first transistor, the correction node being coupled by a capacitance to the sense node; and a second switch configured to selectively couple the correction node to a reset voltage.

According to one embodiment, the light-sensing element is an unpinned photodiode.

According to one embodiment, the pixel circuit further comprises a reset switch coupling the sense node to the further reset voltage.

According to one embodiment, the capacitance coupling the correction node to the sense node is implemented by a capacitor.

According to one embodiment, the capacitance coupling the correction node to the sense node is implemented at least partially by a capacitance present between the control node of the first transistor and a bulk of the first transistor.

According to one embodiment, the first transistor is formed in a first region of the n or p conductivity type, the first region being isolated from a substrate of the pixel circuit.

According to one embodiment, the first region is of the opposite conductivity type to the substrate.

According to one embodiment, the first region is of the same conductivity type as the substrate, and is isolated from the substrate by a second region formed of the opposite conductivity type to the first region.

According to one embodiment, the capacitance coupling the correction node to the sense node is partially implemented by a capacitor coupled between the control node of the first transistor and a bulk of the first transistor.

According to one embodiment, the input node of the reset voltage correction circuit is connected to the sense node.

According to one embodiment, the input node of the reset voltage correction circuit is connected to the source of the first transistor.

According to a further aspect, there is provided an image sensor comprising: an array of the above pixel circuits; and a control circuit configured to generate a first control signal for rendering the first switch conductive while the reset voltage, or a further reset voltage, is applied to the sense node.

According to one embodiment, the control circuit is further configured generate the first control signal in order to render the first switch non-conductive and to generate a second control signal for rendering the second switch conductive in order to apply the reset voltage to the correction node and thereby correct the reset voltage level present at the sense node.

According to a further aspect, there is provided a method of resetting a voltage at a sense node of a pixel circuit, the method comprising: coupling, using a first switch of the pixel circuit, an input node of a reset voltage correction circuit to a correction node, the input node being connected to the sense node or to the source of a first transistor, the correction node being coupled by a capacitance to the sense node, the sense node being coupled to a light-sensing element, wherein the first transistor has its control node coupled to a sense node and its source coupled to a readout path of the pixel circuit and the capacitance coupling the correction node to the sense node is for example implemented at least partially by a capacitance present between the control node of the first transistor and a bulk of the first transistor; coupling, using a second switch, the correction node to a reset voltage.

According to a further aspect, there is provided an image sensor comprising: one or more pixel circuits, each pixel circuit comprising: a light-sensing element; a first transistor having its control node coupled to a sense node and its source coupled to a readout path of the pixel circuit; and a reset voltage correction circuit comprising: a first switch configured to selectively couple an input node of the reset voltage correction circuit to a correction node, the input node being connected to the source of the first transistor, the correction node being coupled by a capacitance to the sense node; and a second switch configured to selectively couple the correction node to a reset voltage; and a current source coupled to the readout path of each pixel circuit via an output line.

According to one embodiment, the light-sensing element is an unpinned photodiode.

According to one embodiment, the pixel circuit further comprises a reset switch coupling the sense node to the further reset voltage.

According to one embodiment, the capacitance coupling the correction node to the sense node is implemented by a capacitor.

According to one embodiment, the capacitance coupling the correction node to the sense node is implemented at least partially by a capacitance present between the control node of the first transistor and a bulk of the first transistor.

According to one embodiment, the first transistor is formed in a first region of the n or p conductivity type, the first region being isolated from a substrate of the pixel circuit.

According to one embodiment, the first region is of the opposite conductivity type to the substrate.

According to one embodiment, the first region is of the same conductivity type as the substrate, and is isolated from the substrate by a second region formed of the opposite conductivity type to the first region.

According to one embodiment, the capacitance coupling the correction node to the sense node is partially implemented by a capacitor coupled between the control node of the first transistor and a bulk of the first transistor.

According to one embodiment, the image sensor comprises: an array of the above pixel circuits; and a control circuit configured to generate a first control signal for rendering the first switch conductive while the reset voltage, or a further reset voltage, is applied to the sense node.

According to one embodiment, the control circuit is further configured generate the first control signal in order to render the first switch non-conductive and to generate a second control signal for rendering the second switch conductive in order to apply the reset voltage to the correction node and thereby correct the reset voltage level present at the sense node.

According to yet a further aspect, there is provided a method of resetting a voltage at a sense node of a pixel circuit of an image sensor comprising one or more pixel circuits, a current source being coupled to a readout path of each pixel circuit via an output line, the method comprising: coupling, using a first switch of the pixel circuit, an input node of a reset voltage correction circuit to a correction node, the input node being connected to the source of a first transistor, the correction node being coupled by a capacitance to the sense node, the sense node being coupled to a light-sensing element, wherein the first transistor has its control node coupled to a sense node and its source coupled to the readout path of the pixel circuit; and coupling, using a second switch, the correction node to a reset voltage.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, pixel arrays formed of pixel circuits, and column readout circuits of such pixel arras, are well known in the art, and have not been described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
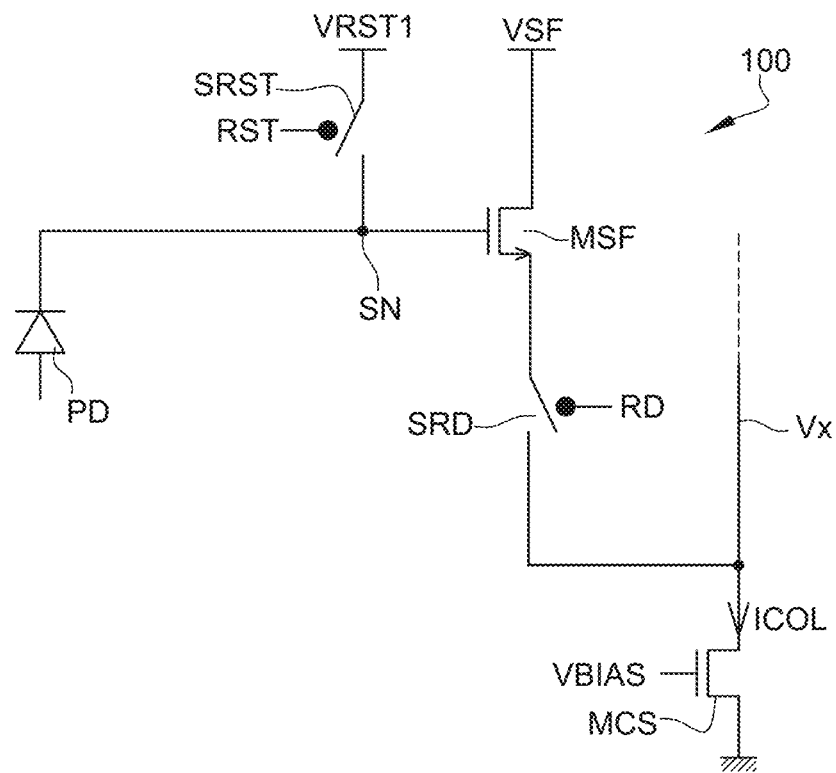
FIG. 1 is a circuit diagram of a 3T pixel circuit of an image sensor that has been proposed.

FIG. 1 is a circuit diagram of a pixel circuit 100 of an image sensor that has been proposed. The pixel circuit 100 comprises a photodetector PD, such as an unpinned photodiode having its cathode connected to a sense node SN. The pixel circuit 100 is a 3T pixel that can be implemented using three transistors. One of these transistors is a source following transistor MSF having its gate connected to the sense node SN, its drain connected to a voltage supply rail VSF, and its source coupled to a column line Vx via a read switch SRD, which is generally implemented by a single transistor. The column line Vx conducts a current ICOL thanks to a current source formed by a transistor MCS coupling the column line Vx to a ground rail and having its gate controlled by a biasing voltage VBIAS. Furthermore, the sense node SN is coupled to a further supply voltage rail VRST1 via a reset switch SRST, which is also generally implemented by a single transistor. The read switch SRD is controlled by a read signal RD, and the reset switch SRST is controlled by a reset signal RST.

In operation, during a reset operation of the pixel circuit 100, a voltage VRST1 on the supply rail VRST1 is applied to the sense node SN via the switch SRST. During an integration phase, the switch SRST is then opened such that incident light is integrated by the photodiode PD and converted into a photonic current that discharges the sensor node SN. At the end of the integration period, a final voltage Vfin_integ present at the sense node SN can be read out via the source follower transistor MSF by activating the switch SRD.

However, a problem is that the transistor implementing the switch SRST will have an ON resistance during the reset operation that varies due to thermal noise. Therefore, when the switch SRST is opened at the end of the reset operation, this thermal noise is sampled, causing the voltage VRST1+Vnoise to be stored at the sense node SN, where Vnoise is the thermal noise. This thermal noise is also known as reset noise or kTC noise, and can be expressed, in V/√Hz, as:

$$\sqrt{\left(\frac{kT}{C}\right)}$$ [Math 1]

where k is the Boltzmann constant, T is the temperature, and C is the equivalent sampling capacitance present at the sense node SN.

The kTC noise significantly degrades the sensitivity of the pixel, as well as its signal-to-noise ratio (SNR).

Figure 2:
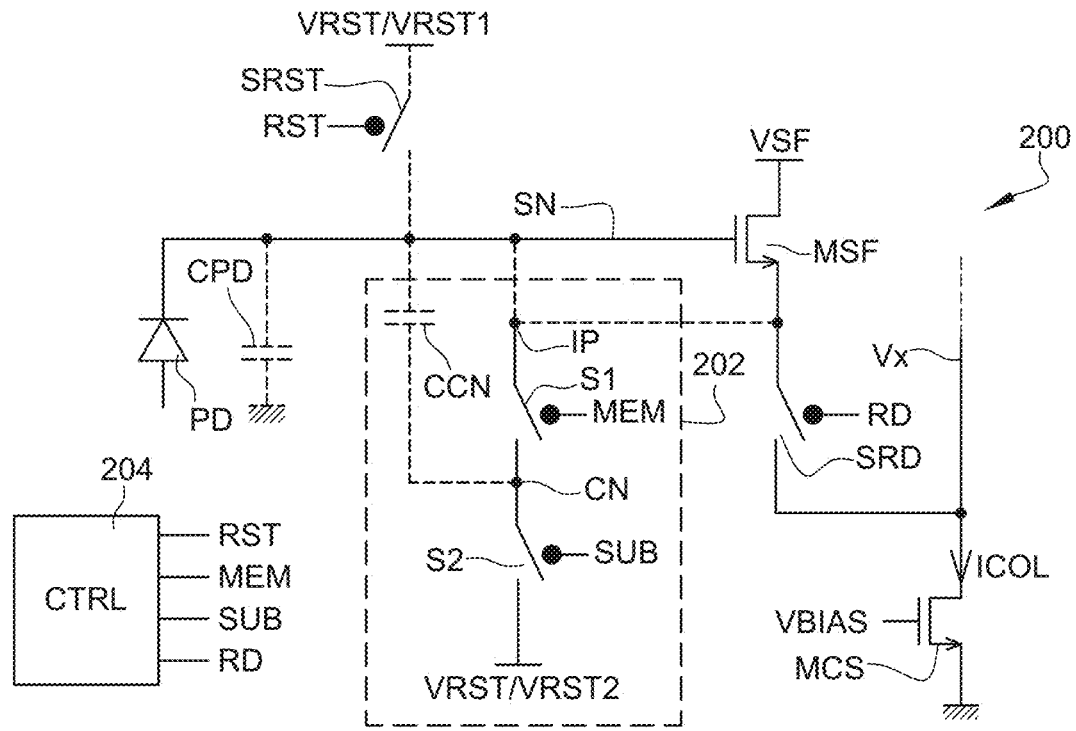
FIG. 2 is a circuit diagram of a pixel circuit according to an example embodiment of the present disclosure.

FIG. 2 is a circuit diagram of a pixel circuit 200 according to an example embodiment of the present disclosure.

The pixel circuit 200 has some features in common with the pixel circuit 100 of FIG. 1, and these features will not be described again in detail. In particular, the pixel circuit 200 comprises a photodetector PD, a sense node SN, a source follower transistor MSF and a read switch SRD.

The photodetector PD is depicted in FIG. 2 as a photodiode, and is for example implemented by an unpinned photodiode. However, in alternative embodiments, the photodetector PD could be another type of photodetector, such as a pyroelectric detector or an organic device, including those of formed of group III-V or group II-VI semiconductor compounds.

The source follower transistor MSF is an n-channel MOS (NMOS) transistor in the example of FIG. 2. Furthermore, the pixel 200 is coupled via the read switch SRD to a column line Vx that is for example common for a column of the pixels 200. The column line Vx is for example coupled to current source which, like in the example of FIG. 1, is implemented by an n-channel MOS (NMOS) transistor controlled by a biasing voltage VBIAS.

The equivalent capacitance CPD of the photodetector is represented by dashed lines in FIG. 2, and for example has a value of between 1 and 10 fF, and for example of substantially 3 fF in one example. The reset switch SRST is optional in the embodiment of FIG. 2, as will be explained in more detail below, and couples the sense node SN to a voltage rail at the reset voltage VRST or VRST1.

The pixel circuit 200 further comprises a reset voltage correction circuit 202, which is configured to at least partially remove kTC noise generated at the sense node SN during the reset operation. The circuit 202 for example comprises switches S1 and S2.

As represented by dashed lines in FIG. 2, the switch S1 has one of its nodes connected to an input node IP of the circuit 202, and this input node IP is either connected directly to the sense node SN, or it is coupled to the sense node SN via the source of the transistor MSF. Indeed, the source of the transistor MSF reproduces the voltage at the sense node SN with an offset of Vt, corresponding to the threshold voltage of the transistor MSF.

The other node of the switch S1 is coupled, for example connected, to a correction node CN. The switch S1 is controlled by a voltage signal MEM.

The correction node CN is coupled to the sense node SN by a capacitance CCN. As will be explained in more detail below, in some embodiments the capacitance CCN is implemented by a capacitor coupled, for example connected, between the correction node CN and the sense node SN, while in other embodiments the capacitance CCN is implemented by the gate capacitance of the source follower transistor MSF. This capacitance is for example in the range 1 to 500 fF and for example in the range 10 to 50 fF. In general, the greater the capacitance CCN, the closer to 1 will be the gain during kTC noise correction.

The correction node CN is also coupled, for example connected, to one node of the switch S2, the other node of which is coupled, for example connected, to a voltage supply rail at the reset voltage VRST or at another level VRST2. Indeed, as explained in more detail below, in some embodiments, the resetting of the sense node SN to the reset voltage VRST is performed via the switches S1 and S2, meaning that the reset switch SRST can be omitted. Alternatively, if the reset switch SRST is present and the switch S1 is connected to the source of the transistor MSF, the voltage of the reset voltage rail is labelled VRST1, and the second voltage level VRST2 is used for the switch S2. As will become apparent from the description below, the voltage VRST2 is for example equal to VRST1−Vt, where Vt is the threshold voltage of the transistor MSF. The switch S2 is for example controlled by a voltage signal SUB.

The switches SRST, SRD, S1 and S2 in the embodiment of FIG. 2 are for example implemented by NMOS transistors.

FIG. 2 further illustrates a control circuit (CTRL) 204 that generates the voltage signals RST, MEM, SUB and RD for controlling the switches SRST (if present), S1, S2 and SRD respectively. This control circuit 204 is for example part of a row driver of a pixel array comprising a plurality of the pixels 200, and the voltage signals RST, MEM, SUB and RD are for example provided on corresponding control lines that are common for each row of the pixel array. This for example permits a rolling shutter operation according to which rows are activated in sequence, as known by those skilled in the art.

Figure 3:
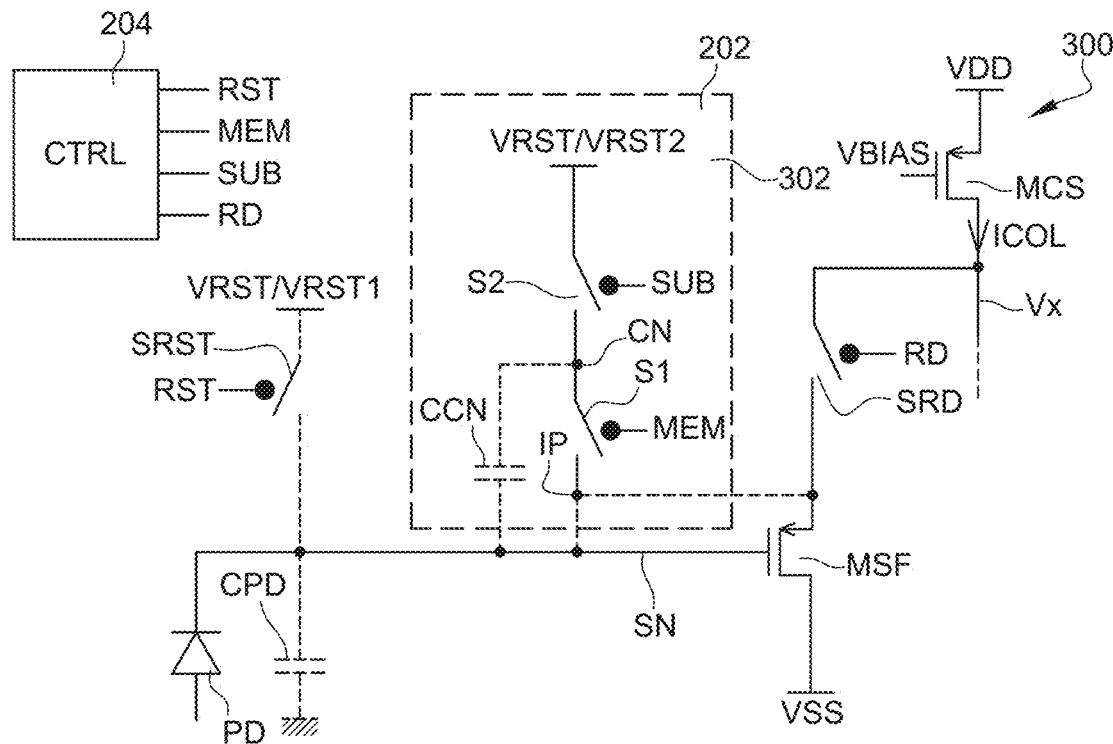
FIG. 3 is a circuit diagram of a pixel circuit according to a further example embodiment of the present disclosure.

FIG. 3 is a circuit diagram of a pixel circuit 300 according to a further example embodiment of the present disclosure. The pixel circuit 300 is very similar to the pixel circuit 200, except that the source follower transistor MSF in FIG. 3 is implemented by a p-channel MOS (PMOS) transistor. Thus, the supply voltage rail VSF is replaced by a supply voltage rail VSS, and the courant source of the column is implemented by a PMOS transistor MCS coupled to a VDD supply rail.

The switches SRST, SRD, S1 and S2 in the embodiment of FIG. 3 are for example implemented by PMOS transistors.

Operation of the pixel circuits 200 and 300 of FIGS. 2 and 3 will now be described in more detail with reference to FIG. 4.

Figure 4:
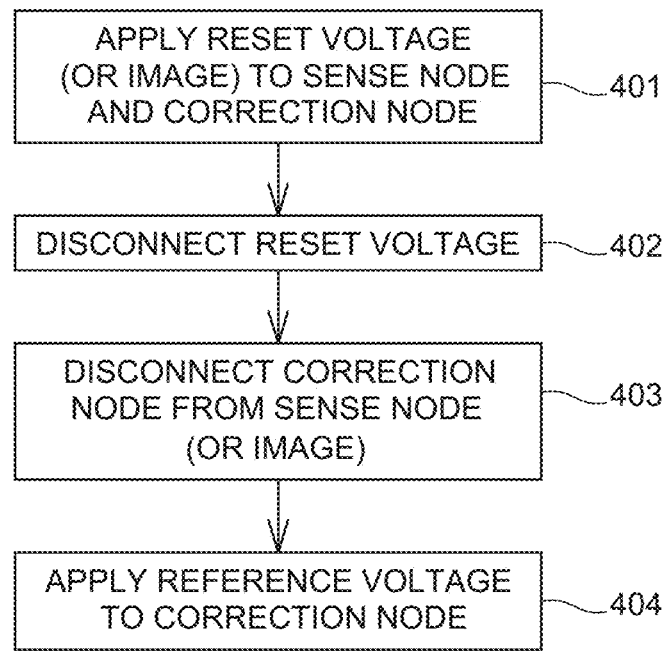
FIG. 4 is a flow diagram representing operations in a method of resetting the sense node of a pixel circuit to a reset voltage level according to an example embodiment of the present disclosure.

FIG. 4 is a flow diagram representing operations in a method of resetting the sense node of a pixel circuit to a reset voltage level according to an example embodiment of the present disclosure. The method of FIG. 4 is for example implemented prior to each an integration period of a pixel, and is for example implemented by the control circuit 204, which for example controls entire rows of pixels of an image sensor at once.

In an operation 401, the reset voltage VRST is applied to the sense node SN and to the correction node CN of the pixel. For example, if the switch SRST is present, this is achieved by rendering conducting the switches SRST and S1, while the read switch SRD remains non-conducting. In the case that the switch SRST is not present, the switch S1 is for example connected to the sense node rather than to the source of the transistor MSF, and this operation involves rendering conductive both the switches S1 and S2, with switch S2 being coupled to the VRST supply voltage rail. In either case, the voltage VSN at the sense node SN for example becomes equal to the reset voltage VRST. The voltage VCN at the correction node CN is for example also equal to the voltage level VRST if the switch S1 is connected to the sense node SN, or to the voltage level VRST1–Vt if the switch S1 is connected to the source of the transistor MSF, where Vt is the threshold voltage of the transistor MSF.

In an operation 402, the reset voltage is disconnected. For example, if the switch SRST is present, this is achieved by rendering non-conductive the switch SRST. If the switch SRST is not present, this is achieved by rendering non-conductive the switch S2. In either case, this for example causes the voltage VSN at the sense node SN to become equal to VRST+VkTC or to VRST1+VkTC, where VkTC is the kTC noise. The voltage at the correction node CN also becomes equal to VRST+VkTC in the case that the switch S1 is connected to the sense node SN, or to VRST1+VkTC–Vt in the case that the switch S1 is connected to the source of the transistor MSF.

In an operation 403, the correction node CN is disconnected from the sense node SN. This is for example achieved by rendering non-conductive the switch S1. This results in a parasitic coupling resulting in a voltage variation dV on each side of the switch S1. The correction node CN and sense node SN thus both store a voltage level VRST+VkTC+dV in the case that the switch S1 is connected to the sense node SN. In the case that the switch S1 is connected to the source of the transistor MSF, the correction node CN stores the voltage level VRST1+VkTC–Vt+dV, and the sense node SN stores the voltage level VRST1+VkTC+dV.

In an operation 404, a reference voltage is applied to the correction node CN by rendering conductive the switch S2. The coupling of the nodes CN and SN by the capacitance CCN, and the absence of a current across this capacitance, causes both the nodes CN and SN to follow the same voltage variation seen by the node CN, resulting in the voltage VSN at the sense node SN becoming equal to the level VRST in the case that the switch S1 is connected to the sense node SN, or to the level VRST2+Vt in the case the switch S1 is connected to the source of the transistor MSF. Thus, the noise component VkTC is suppressed.

Various further embodiments of pixel circuits similar to those of FIGS. 2 and 3 will now be described with reference to FIGS. 5 to 20. In the various circuit diagrams, features in common with the embodiments of FIGS. 2 and 3 have been labelled with like reference numerals.

Figure 5:
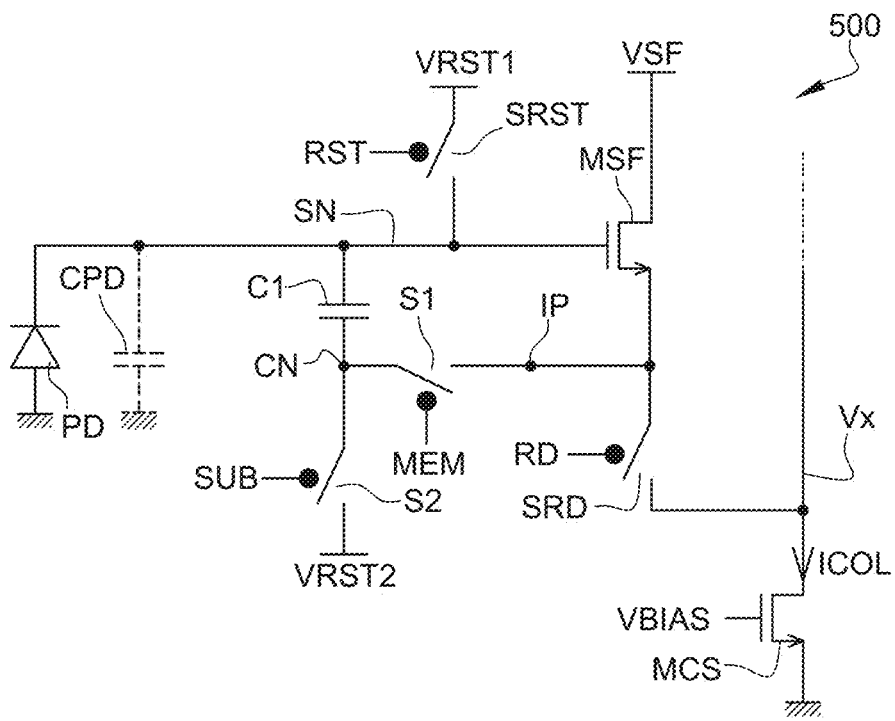
FIG. 5 is a circuit diagram of a pixel circuit according to a further example embodiment of the present disclosure.

FIG. 5 is a circuit diagram of a pixel circuit 500 according to a further example embodiment of the present disclosure.

In the pixel circuit 500 of FIG. 5, the source follower transistor MSF is an NMOS transistor. Furthermore, the circuit 500 for example comprises the reset switch SRST coupling the sense node SN to the voltage supply rail VRST1, the circuit 500 comprises a capacitor C1 implementing the capacitance CCN, and the correction node CN is coupled to the source of the source follower transistor MSF.

In some embodiments, the capacitor C1 has a capacitance in the range 10 to 500 fF, and for example in the range 10 to 50 fF. In one example, the capacitor C1 has a capacitance of around 20 fF.

Figure 6:
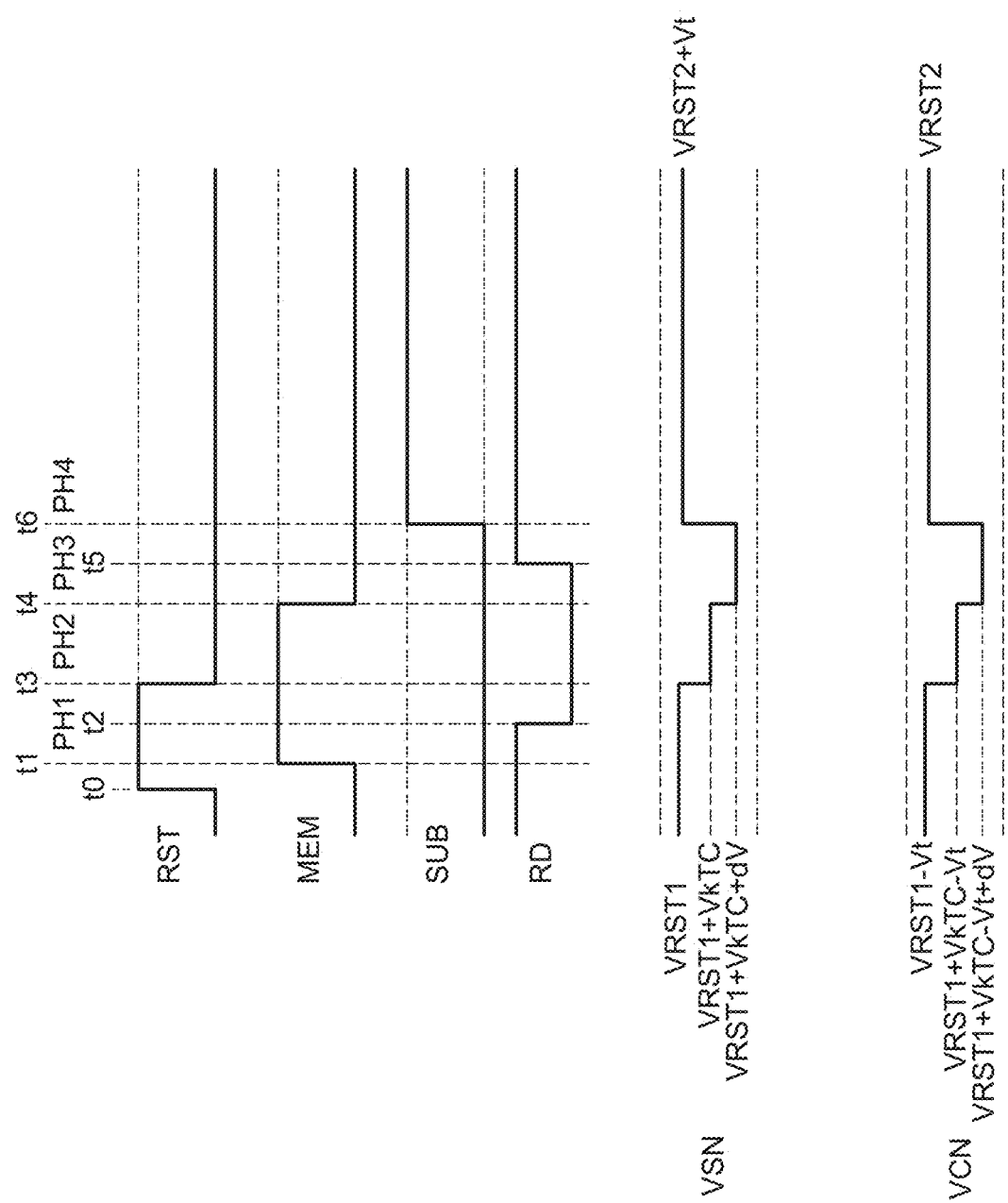
FIG. 6 is a timing diagram showing an example of signals in the pixel circuit of FIG. 5.

FIG. 6 is a timing diagram showing an example of signals RST, MEM, SUB and RD in the pixel circuit 500 of FIG. 5 during a reset operation, assuming that the switches SRST, S1, S2 and SRD are NMOS transistors. FIG. 6 also shows examples of the voltages VSN and VCN present at the sense node SN and correction node CN respectively.

Initially, before the start of the reset operation, the signals RST, MEM and SUB are all for example at a low state, implying that the switches SRST, S1 and S2 are non-conducting, and the signal RD is at a high state, implying that the switch SRD is conducting.

At a time t0, the reset signal RST for example goes to a high state, rendering conductive the reset switch RST. Then, at a time t1, the signal MEM for example goes high, starting a phase PH1, during which both the signals RST and MEM are at a high state, and the signal SUB is at a low state. This implies that the switches SRST and S1 are conducting. This phase PH1 corresponds to the operation 401 of FIG. 4 described above. The voltage VSN at the SN is thus equal to the level VRST1, and the voltage VCN at the correction node CN is equal to VRST1–Vt.

At a time t2, the read signal RD for example falls to the low state.

At a time t3, the reset signal RST falls to the low state, starting a subsequent phase PH2 during which the sense node SN is isolated from the voltage rail VRST1, and the switch S1 remains conducting. This phase PH2 corresponds to the operation 402 of FIG. 4 described above, and in this example the voltage VSN at the sense node SN falls to VRST1+VkTC, where VkTC is a negative voltage in the example of FIG. 6, but could be positive in other examples, and the voltage VCN at the correction node CN falls to VRST1+VkTC−Vt.

At a time t4, the signal MEM falls to the low state, starting a phase PH3, during which a voltage VRST1+VkTC−Vt+dV is stored at the correction node CN, and a voltage VRST1+VkTC+dV is stored at the sense node SN. This phase PH3 corresponds to the operation 403 of FIG. 4 described above.

During the phase PH3, at a time t5, the signal read RD for example transitions to the high state, in preparation for the read operation.

At a time t6, the signal SUB is brought to the high state, starting a final phase PH4 of the reset operation. This results in the voltage VCN at the correction node CN becoming equal to VRST2 and the voltage VSN at the sense node SN becoming equal to VRST2+Vt.

The signals SUB and RD then for example remain at the high state during a subsequent integration period.

While in the example of FIG. 6 the read signal RD is low during the phase PH2, in alternative embodiments it could remain high throughout the reset operation, implying that the read switch SRD remains conducting throughout the reset operation.

Figure 7:
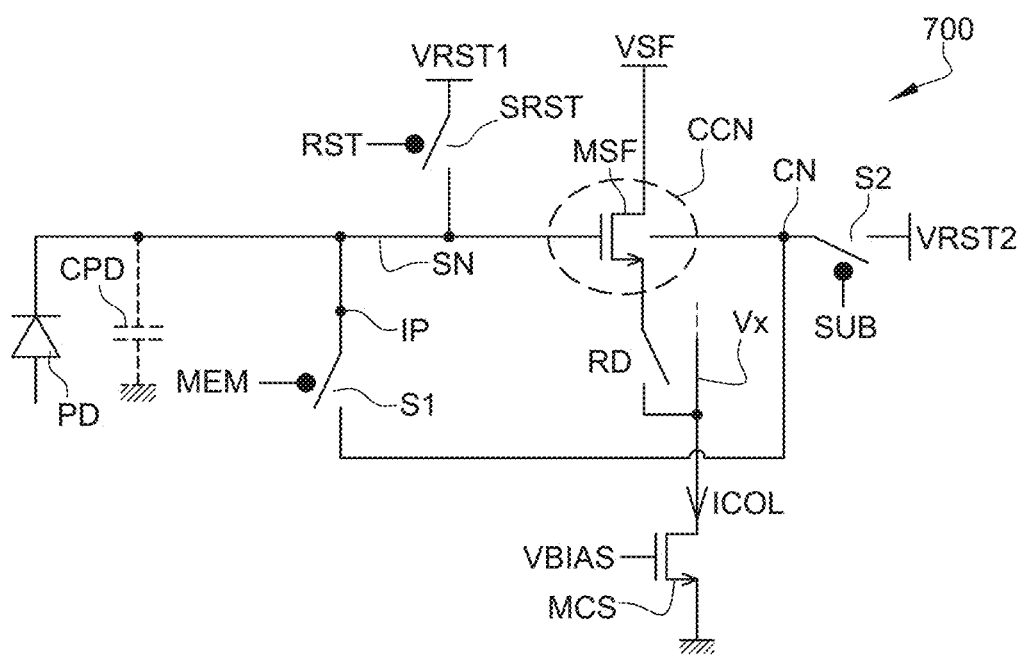
FIG. 7 is a circuit diagram of a pixel circuit according to a further example embodiment of the present disclosure.

FIG. 7 is a circuit diagram of a pixel circuit 700 according to a further example embodiment of the present disclosure.

In the pixel circuit 700 of FIG. 7, the source follower transistor MSF is an NMOS transistor. Furthermore, the circuit 700 for example comprises the reset switch SRST coupling the sense node SN to the voltage supply rail VRST1. However, there is no capacitor C1 in the embodiment of FIG. 7. Instead, the gate of the source follower transistor MSF provides the capacitance CCN. For example, the transistor MSF is a bulk device, and the bulk is an isolated region. The capacitance CCN in this case is for example in the range 1 to 50 fF, and for example in the range 4 to 20 fF.

Thus, in the pixel circuit 700, the correction node CN is coupled, for example connected, to the bulk of the transistor MSF, and is thus coupled to the sense node SN by the capacitance CCN of the transistor MSF. Like in previous embodiments, the correction node CN is also coupled to the sense node SN via the switch S1, and to the reset voltage rail VRST2 via the switch S2. In some embodiments, the reset voltages VRST1 and VRST2 are equal. Furthermore, if the transistor MSF is an NMOS transistor, the voltage VRST2 is for example equal to the VSS or ground voltage. Alternatively, if the transistor MSF is a PMOS transistor, the voltage VRST2 is for example equal to the supply voltage VDD or VSF.

Operation of the pixel circuit 700 is for example similar to that of the pixel circuit 500, and the signals RST, MEM, SUB and RD can for example have the same timing as in the example of FIG. 6. However, the voltage drop Vt will not be present in the voltages VSN and VCN in the example of FIG. 7.

An advantage of the embodiment of FIG. 7 is that there is no additional capacitor added to the pixel circuit with respect to the 3T pixel circuit of FIG. 1. Furthermore, the gain during the kTC noise correction is close to 1. The source-follower transistor MSF is, however, modified to have an isolated bulk. An example of an isolated bulk will now be described in more detail with reference to FIGS. 8 to 12.

Figure 8:
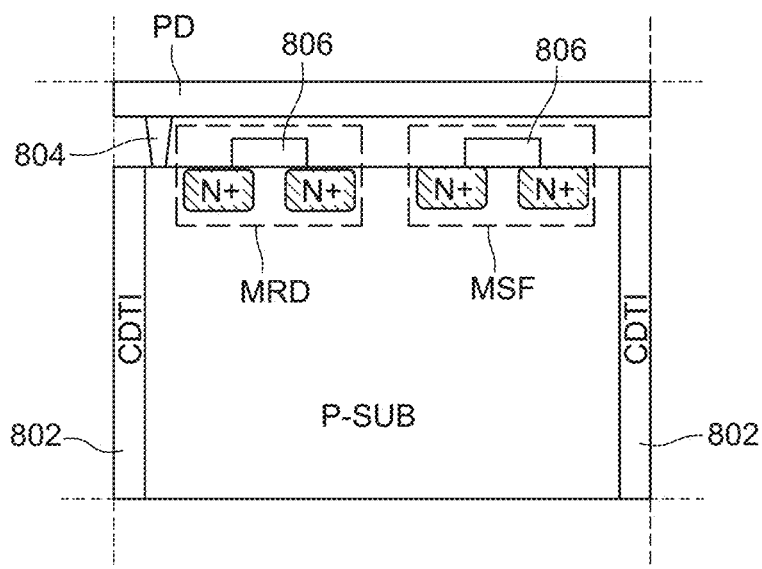
FIG. 8 is a cross-section view of part of a pixel circuit comprising a p-type substrate and an n-channel source-follower transistor.

FIG. 8 is a cross-section view of part of a pixel circuit comprising a p-type substrate P-SUB, an NMOS read transistor MRD, and an NMOS source-follower transistor MSF according to an example in which the bulk is not isolated. For example, this corresponds to a cross-section view of part of the pixel circuit 200 of FIG. 2, in which the read switch SRD is implemented by the NMOS transistor MRD.

The P-type substrate P-SUB of the pixel circuit is for example biased at a voltage VSS, and is insulated from neighboring pixels by isolation trenches 802, which are for example capacitive deep trench isolations (CDTI), as is well known in the art.

In the example of FIG. 8, the photodetector PD is formed above the pixel, and is for example coupled to the substrate P-SUB by one or more vias 804. Each of the NMOS transistors MRD, MSF is for exampled formed by source/drain regions (N+) formed in the P-type substrate P-SUB and separated by a channel region, and a gate stack 806 formed over the channel region and in some cases partially overhanging the source/drain regions.

Figure 9:
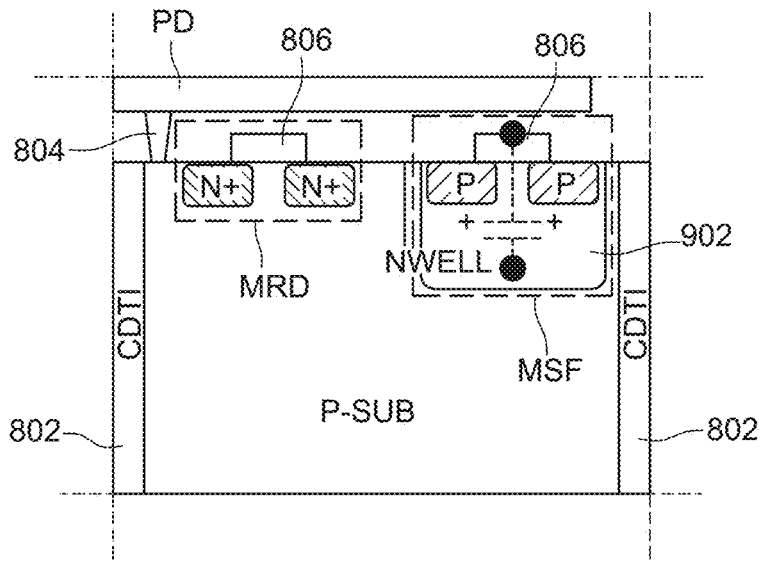
FIG. 9 is a cross-section view of part of a pixel circuit comprising a p-type substrate and a source-follower transistor having an isolated n-type well.

FIG. 9 is a cross-section view of part of a pixel circuit comprising a p-type substrate P-SUB, a read transistor MRD and a source-follower transistor MSF formed in an isolated n-type well (NWELL). For example, the structure of FIG. 9 corresponds to a part of the pixel circuit of the embodiment of FIG. 7, but in which the source-follower transistor MSF is implemented by a PMOS device. The structure is similar to that of FIG. 8, and like features have been labelled with like reference numerals and will not be described again in detail. However, with respect to the embodiment of FIG. 8, the MSF transistor in FIG. 9 is formed in an n-type well (NWELL) 902, and the source/drain regions of the MSF transistor are formed by p-type regions (P). A capacitor, shown by dashed lines in FIG. 9, represents the capacitance between the gate electrode of the gate stack 806 of the MSF transistor, and the NWELL 902, this capacitance corresponding to the capacitance CCN in the embodiment of FIG. 7.

Figure 10:
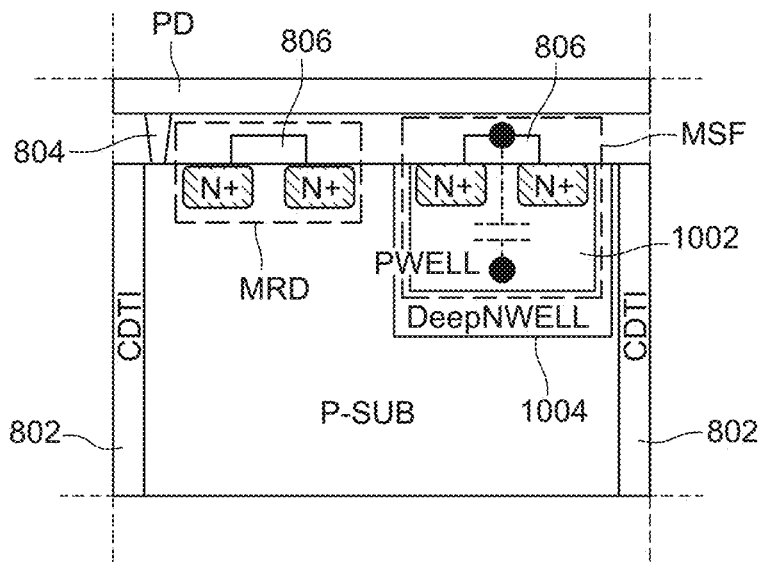
FIG. 10 is a cross-section view of part of a pixel circuit comprising a p-type substrate and a source-follower transistor having an isolated p-type well.

FIG. 10 is a cross-section view of part of a pixel circuit comprising a p-type substrate P-SUB, read transistor MRD, and a source-follower transistor MSF formed in an isolated p-type well (PWELL) 1002. For example, the structure of FIG. 10 corresponds to a part of the pixel circuit of the embodiment of FIG. 7, and in this example the source-follower transistor MSF is implemented by NMOS device. The structure is similar to that of FIG. 8, and like features have been labelled with like reference numerals and will not be described again in detail. However, with respect to the embodiment of FIG. 8, the MSF transistor in FIG. 10 is formed in the isolated PWELL 1002, which is isolated from the P-type substrate P-SUB by a deep n-type well (Deep-NWELL) 1004 forming a barrier between the PWELL 1002 and the P-type substrate P-SUB. A capacitor, shown by dashed lines in FIG. 10, represents the capacitance between the gate electrode of the gate stack 806 of the MSF transistor, and the PWELL 1002, this capacitance corresponding to the capacitance CCN in the embodiment of FIG. 7.

Figure 11:
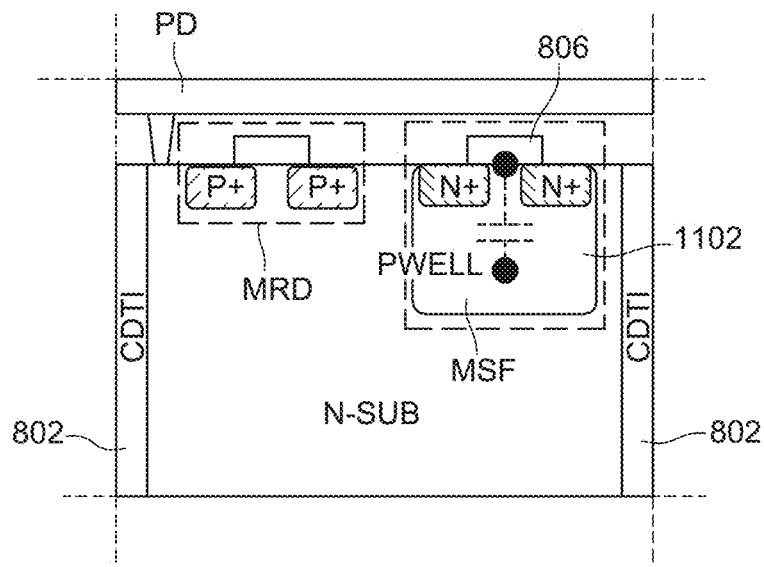
FIG. 11 is a cross-section view of part of a pixel circuit comprising an n-type substrate and a source-follower transistor having an isolated p-type well.

FIG. 11 is a cross-section view of part of a pixel circuit comprising an n-type substrate N-SUB, a read transistor MRD, and a source-follower transistor MSF formed in an isolated PWELL 1102. For example, the structure of FIG. 11 corresponds to a part of the pixel circuit of the embodiment of FIG. 7, and is similar to the embodiment of FIG. 9, except that the conduction types are inversed.

Figure 12:
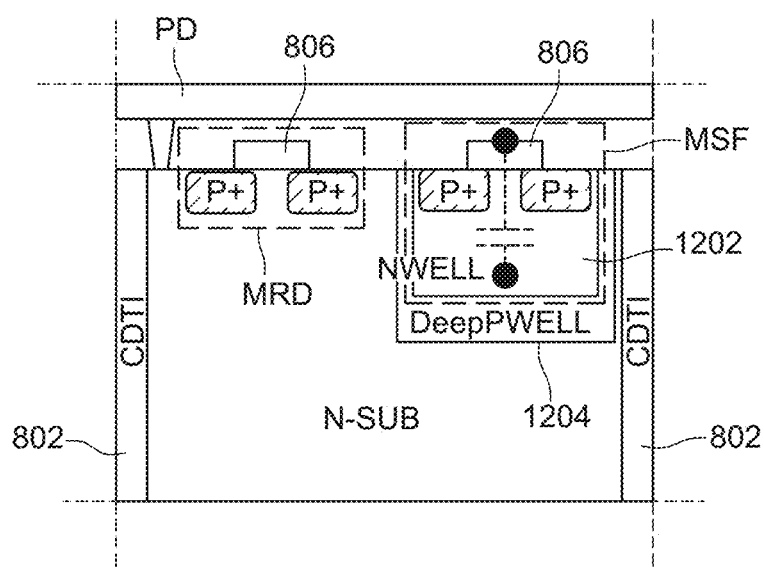
FIG. 12 is a cross-section view of part of a pixel circuit comprising an n-type substrate and a source-follower transistor having an isolated n-type well.

FIG. 12 is a cross-section view of part of a pixel circuit comprising an n-type substrate N-SUB, a read transistor MRD, and a source-follower transistor MSF formed in an NWELL 1202 isolated from the n-type substrate N-SUB by a deep PWELL 1204. For example, the structure of FIG. 12 corresponds to a part of the pixel circuit of the embodiment of FIG. 7, and is similar to the embodiment of FIG. 10, except that the conduction types are inversed.

Figure 13:
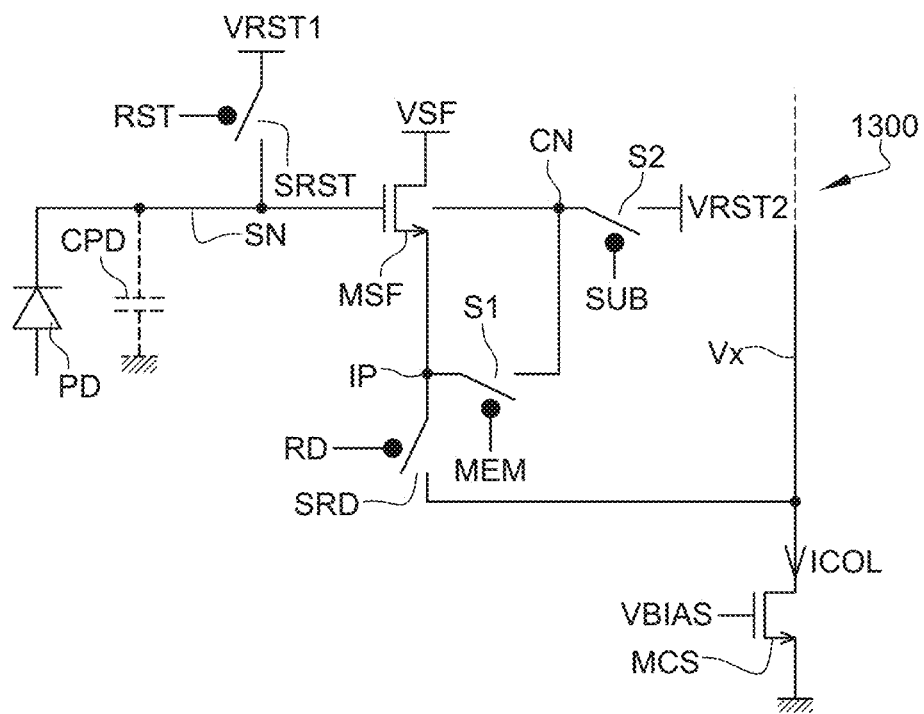
FIG. 13 is a circuit diagram of a pixel circuit according to a further example embodiment of the present disclosure.

FIG. 13 is a circuit diagram of a pixel circuit 1300 according to a further example embodiment of the present disclosure. The embodiment of FIG. 13 is similar to that of FIG. 7. However, in the embodiment of FIG. 13, rather than the input IP of the reset voltage correction circuit being coupled to the sense node SN like in the embodiment of FIG. 7, the input IP is coupled, for example connected, to the source of the source-follower transistor MSF, like in the embodiment of FIG. 5.

Operation of the embodiment of FIG. 13 will now be described in more detail with reference to FIG. 14.

Figure 14:
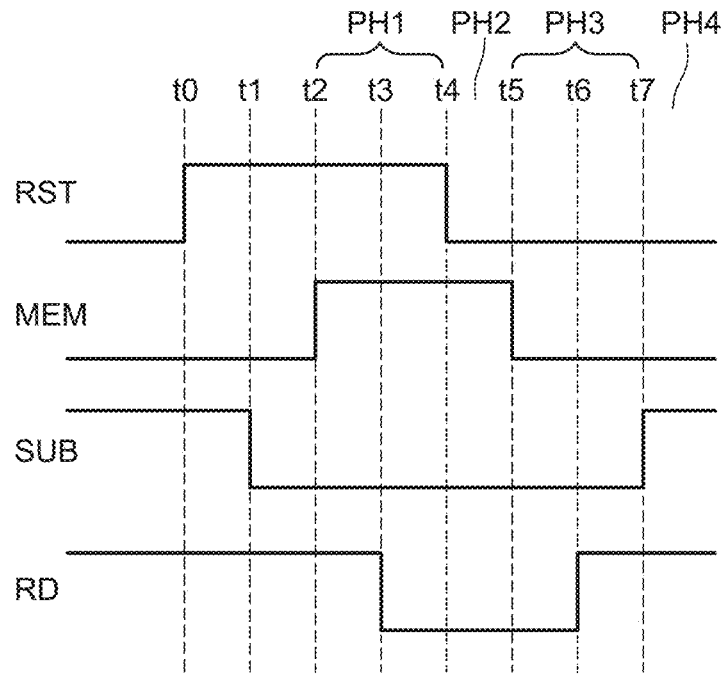
FIG. 14 is a timing diagram showing an example of signals in the pixel circuit of FIG. 13.

FIG. 14 is a timing diagram showing an example of the signals RST, MEM, SUB and RD in the pixel circuit of FIG. 13.

Initially, the signals RST and MEM are for example at the low state, implying that the switches SRST and S1 are non-conducting, and the signals SUB and RD are for example at the high state, implying that the switches S2 and SRD are conducting.

At a time t0, the signal RST for example goes to the high state. An advantage of having the switches S2 and SRD conducting at the same time as the reset switch SRST is that the transistor MSF will be well biased, implying that its bulk will not be floating, and the transistor MSF will be crossed by a current, thereby correctly driving its source. This allows, in particular, to set an operating point for which a change in the value of the MSF source voltage due to any leakage via the bulk can be avoided. At a time t1, the signal SUB then for example falls to the low state.

At a time t2, the signal MEM for example rises to the high state, starting the phase PH1 during which an image of the voltage at the sense node SN is applied to the correction node CN. At a time t3 during the phase PH1, the read signal RD for example falls to the low state.

At a time t4, the reset signal RST falls to the low state, starting the phase PH2 during which the sense node voltage VSN is sampled with the kTC noise.

At a time t5, the signal MEM falls to the low state, starting the phase PH3 during which the voltage VCN at the correction node CN is stored. At a time t6 during the phase PH3, the read signal RD rises to the high state.

At a time t7, the signal SUB rises to the high state, starting the phase PH4, in which the reset voltage at the sense node SN is corrected.

Figure 15:
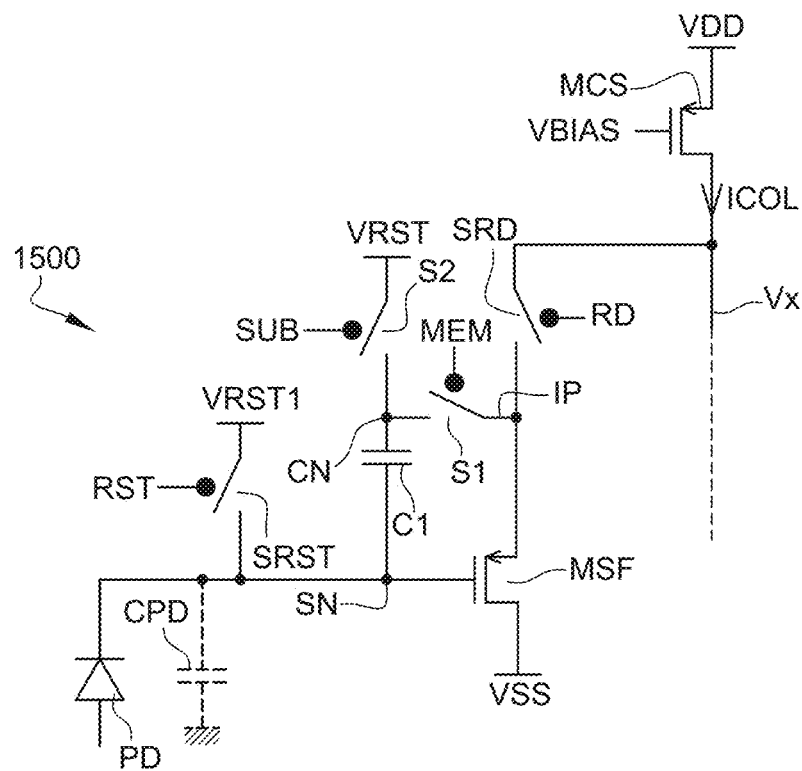
FIG. 15 is a circuit diagram of a pixel circuit according to a further example embodiment of the present disclosure.

FIG. 15 is a circuit diagram of a pixel circuit 1500 according to a further example embodiment of the present disclosure. The pixel circuit 1500 of FIG. 15 is similar to the pixel circuit 500 of FIG. 5, except that the source-follower transistor MSF is implemented by a PMOS transistor rather than an NMOS transistor. In some embodiments, the switches SRST, S1, S2 and SRD in the embodiment of FIG. 15 are also implemented by PMOS transistors.

Operation of the pixel circuit 1500 is for example similar to that of the pixel circuit 500, except that the control signals are of opposite polarity to those described in relation with FIG. 6.

Figure 16:
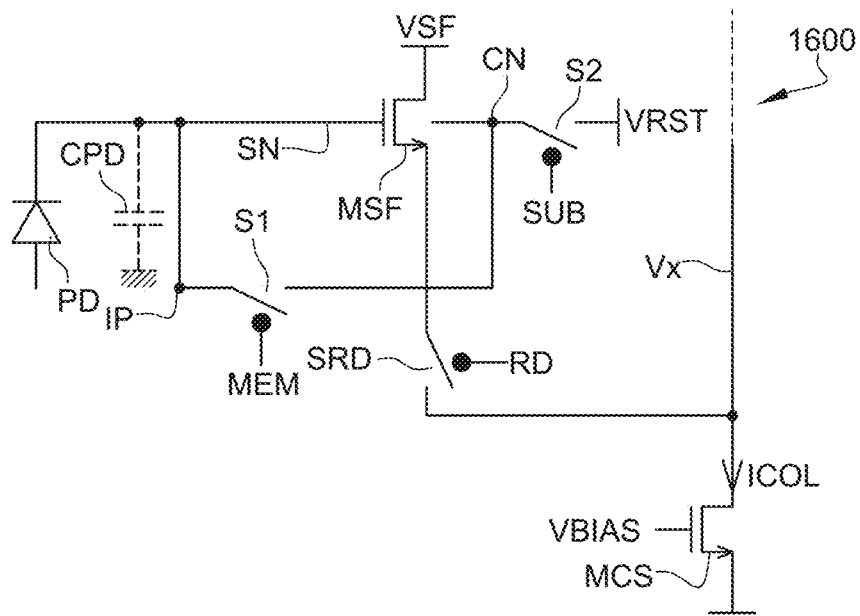
FIG. 16 is a circuit diagram of a pixel circuit according to a further example embodiment of the present disclosure.

FIG. 16 is a circuit diagram of a pixel circuit 1600 according to a further example embodiment of the present disclosure. The embodiment of FIG. 16 is similar to that of FIG. 7, except that the reset switch SRST is removed, and there is only one reset voltage rail VRST. The reset operation is thus performed via the switches S1 and S2, as will now be described in more detail with reference to FIG. 17.

Figure 17:
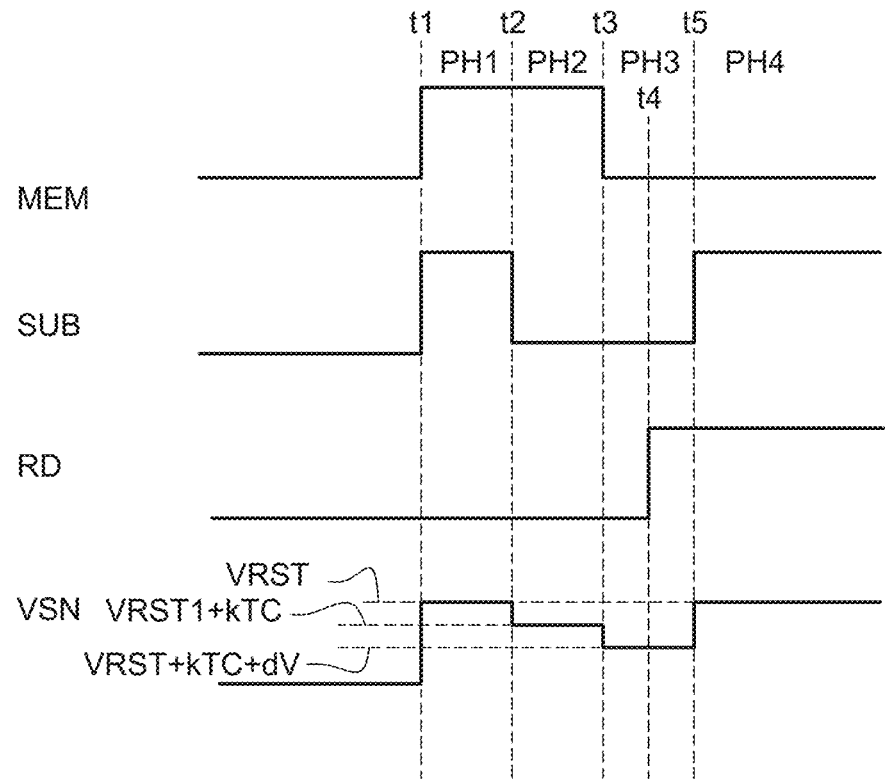
FIG. 17 is a timing diagram showing an example of signals in the pixel circuit of FIG. 16.

FIG. 17 is a timing diagram showing an example of signals MEM, SUB and RD in the pixel circuit 1700 of FIG. 17, as well as an example of the voltage VSN at the sense node SN.

Initially in the example of FIG. 17, the signals MEM and SUB are for example at a low state, and the voltage VSN is also low.

At a time t1, the reset operation starts with the rising of the signals MEM and SUB to the high state, such that the switches S1 and S2 are conducting, thereby coupling the sense node SN to the reset voltage rail VRST. The voltage VSN at the sense node SN thus rises to the level VRST. This corresponds to a first phase PH1.

At a time t2, a second phase PH2 starts with the signal SUB going low, causing the correction node CN to be isolated from the reset voltage rail VRST. This causes the storage of the reset voltage with kTC noise at the sense node SN.

At a time t3, a third phase PH3 starts with the signal MEM falling to the low level, causing the voltage at the correction node CN to be stored. At a time t4 during the third phase, the read signal RD for example rises to the high state.

At a time t5, the fourth phase starts with the signal SUB going high, thereby causing the correction of the reset voltage at the sense node SN.

Figure 18:
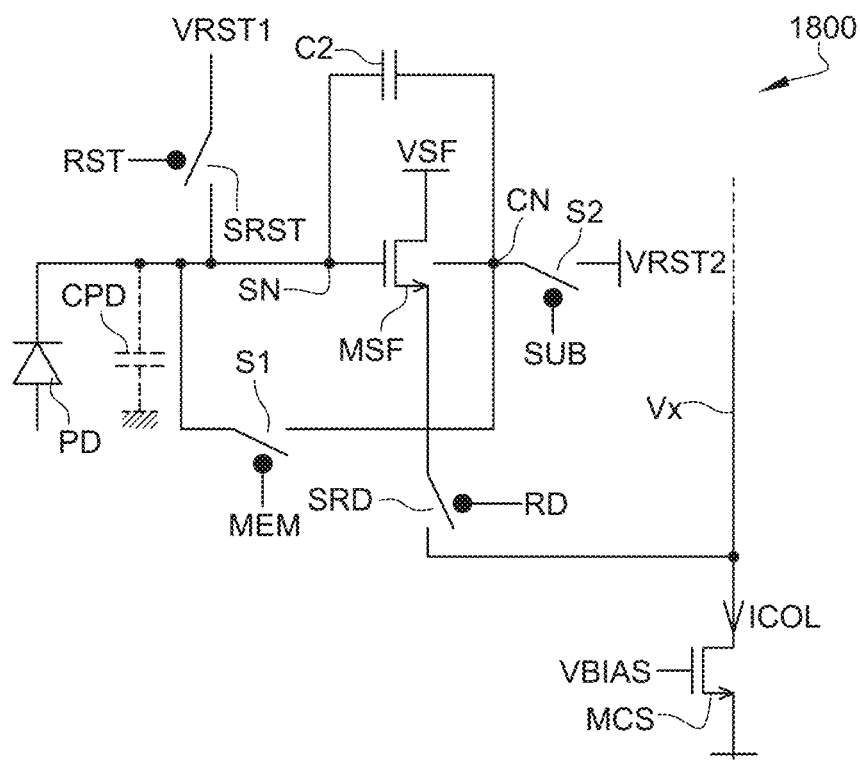
FIG. 18 is a circuit diagram of a pixel circuit according to a further example embodiment of the present disclosure.

FIG. 18 is a circuit diagram of a pixel circuit 1800 according to yet a further example embodiment of the present disclosure. The pixel circuit 1800 is the same as the pixel circuit 700 of FIG. 7, except that it additionally comprises a capacitor C2 coupled between the sense node SN and the correction node CN. Indeed, depending on the dimensions of the source-follower transistor MSF, the capacitance between the gate and the bulk may be relatively low, and it could be preferable to increase the capacitance CCN by the addition of the capacitor C2. In particular, the efficiency of the reset voltage correction operation at the sense node SN will depend in part on the ratio FCorr=CCN/(CCN+CSN), where CSN is the capacitance present at the sense node SN, which is due in part to the capacitance CPD of the photodetector PD. Therefore, the ratio FCorr can be increased by choosing the capacitance CCN to be relatively high. For example, in some embodiments the capacitance CCN is equal to at least 50% of the capacitance CSN, and is preferably equal to or higher than the capacitance CSN.

In some embodiments, the capacitor C2 has a capacitance in the range 10 to 50 fF.

Figure 19:
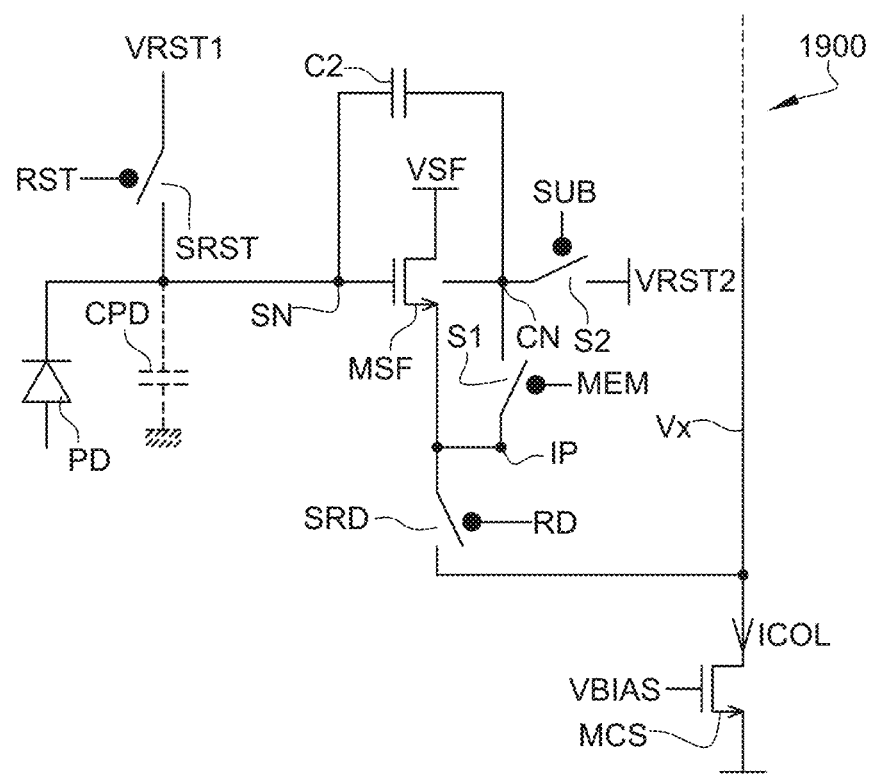
FIG. 19 is a circuit diagram of a pixel circuit according to yet a further example embodiment of the present disclosure.

FIG. 19 is a circuit diagram of a pixel circuit 1900 according to yet a further example embodiment of the present disclosure. The pixel circuit 1900 is the same as the pixel circuit 1300 of FIG. 13, except that, like in the embodiment of FIG. 18, it additionally comprises a capacitor C2 coupled between the sense node SN and the correction node CN.

Figure 20:
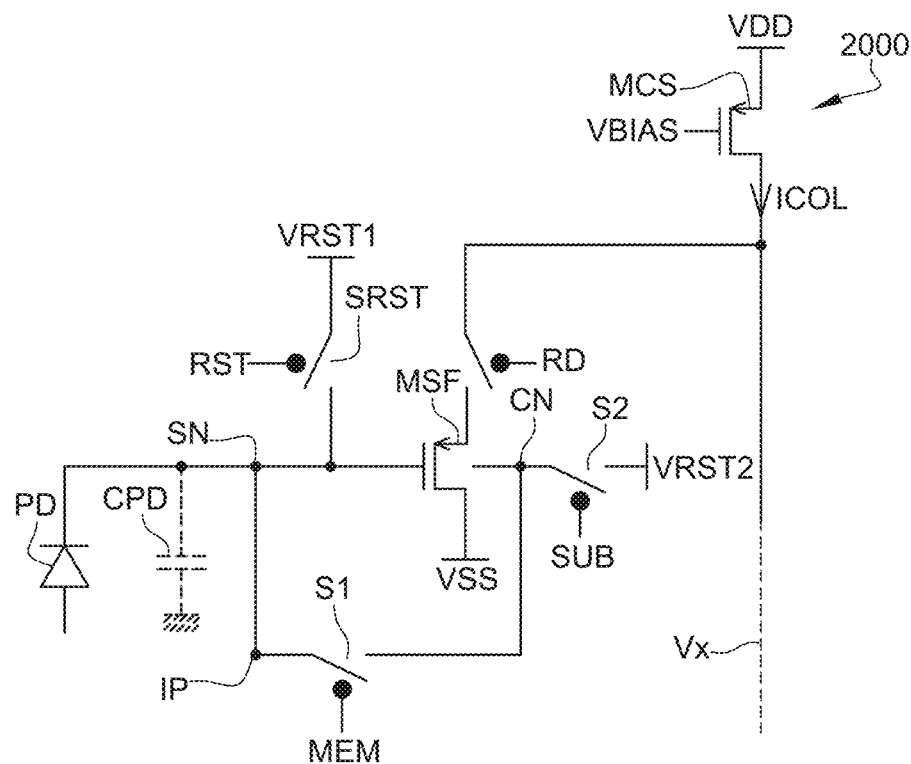
FIG. 20 is a circuit diagram of a pixel circuit according to yet a further example embodiment of the present disclosure.

FIG. 20 is a circuit diagram of a pixel circuit 2000 according to yet a further example embodiment of the present disclosure.

The pixel circuit 2000 of FIG. 20 is similar to the pixel circuit 700 of FIG. 7, except that the source-follower transistor MSF is implemented by a PMOS transistor rather than an NMOS transistor. In some embodiments, the switches SRST, S1, S2 and SRD in the embodiment of FIG. 20 are also implemented by PMOS transistors, although they could also remain as NMOS transistors.

Operation of the pixel circuit 2000 is for example similar to that of the pixel circuit 700, except that the control signals are of opposite polarity to those described in relation with FIG. 6.

An advantage of the embodiments described herein is that a correction of the reset voltage level to remove kTC noise can be performed within the pixel circuit, thereby avoiding the need to perform a double correlated double sampling technique. The present inventor has found that particularly good reset voltage level correction can be obtained by either connecting the input of the reset voltage correction circuit to the source of the MSF transistor, or by coupling the input of the reset voltage correction circuit to the sense node while at least partially using the capacitance between the gate and bulks nodes of the MSF transistor to provide the capacitance CNN.

Furthermore, the embodiments presented herein are relatively compact, involving the addition of as little as a single transistor in the case that the reset transistor is also removed.

An advantage of the embodiments in which the capacitance between the gate and bulk nodes of the MSF transistor is used to provide the capacitance CCN is that the solution is particularly compact and furthermore it is easier to obtain a gain during the reset noise correction of close to 1. Indeed, the gain will be equal to CMSF/(CMSF+CSN), where CMSF is the bulk/gate capacitance of the MSF transistor, and CSN is the capacitance at the sense node.

Various embodiments and variants have been described. Those skilled in the art will understand that certain features of these embodiments can be combined and other variants will readily occur to those skilled in the art. For example, it will be apparent to those skilled in the art that while circuits implemented using MOS transistor technology have been described, in alternative implementations other transistor technologies could be used. Furthermore, one or more of the NMOS transistors in the various circuit could be implemented by PMOS transistors in alternative embodiments, and/or one or more of the PMOS transistors in the various embodiments could be implemented by NMOS transistors.

Furthermore, it will be apparent to those skilled in the art that a broad range of supply voltages could be used for the pixel circuits, and while embodiments have been described in which the pixel circuits are referenced to a ground voltage level, other reference levels would be possible, including negative voltage levels.

Finally, the practical implementation of the embodiments and variants described herein is within the capabilities of those skilled in the art based on the functional description provided hereinabove. In particular, those skilled in the art will understand how to implement one or more photodetectors for each pixel circuit, these photodetectors not being limited to photodiodes.

The invention claimed is:

1. An image sensor comprising:
one or more pixel circuits, each pixel circuit comprising:
a light-sensing element;
a first transistor having its control node coupled to a sense node and its source coupled to a readout path of the pixel circuit; and
a reset voltage correction circuit comprising:
a first switch configured to selectively couple an input node of the reset voltage correction circuit to a correction node, the input node being connected to the source of the first transistor, the correction node being coupled by a capacitance to the sense node; and
a second switch configured to selectively couple the correction node to a reset voltage; and
a current source coupled to the readout path of each pixel circuit via an output line; and
a control circuit configured to:
generate a first control signal for rendering the first switch conductive while the reset voltage is applied to the sense node;
disconnect the reset voltage from the sense node while the first switch remains conductive;
generate the first control signal in order to render the first switch non-conductive to disconnect the correction node from the sense node; and
generate a second control signal for rendering the second switch conductive in order to apply the reset voltage to the correction node and thereby correct the reset voltage level present at the sense node.

2. The image sensor of claim 1, wherein the light-sensing element is an unpinned photodiode.

3. The image sensor of claim 1, further comprising a reset switch coupling the sense node to the further reset voltage.

4. The image sensor of claim 3, wherein the capacitance coupling the correction node to the sense node is implemented by a capacitor.

5. The image sensor of claim 1, wherein capacitance coupling the correction node to the sense node is implemented at least partially by a capacitance present between the control node of the first transistor and a bulk of the first transistor.

6. The image sensor of claim 1, wherein the first transistor is formed in a first region of the n or p conductivity type, the first region being isolated from a substrate of the pixel circuit.

7. The image sensor of claim 6, wherein the first region is of the opposite conductivity type to the substrate.

8. The image sensor of claim 6, wherein the first region is of the same conductivity type as the substrate, and is isolated from the substrate by a second region formed of the opposite conductivity type to the first region.

9. The image sensor of claim 5, wherein capacitance coupling the correction node to the sense node is partially implemented by a capacitor coupled between the control node of the first transistor and a bulk of the first transistor.

10. A method of resetting a voltage at a sense node of a pixel circuit of an image sensor comprising one or more pixel circuits, a current source being coupled to a readout path of each pixel circuit via an output line, the method comprising:
coupling, using a first switch of the pixel circuit, an input node of a reset voltage correction circuit to a correction node, the input node being connected to the source of a first transistor, the correction node being coupled by a capacitance to the sense node, the sense node being coupled to a light-sensing element, wherein the first transistor has its control node coupled to a sense node and its source coupled to the readout path of the pixel circuit and wherein the first switch is rendered conductive by applying, by a control circuit of the image sensor, a first control signal to the first switch while the reset voltage is applied to the sense node;
disconnecting the reset voltage from the sense node while the first switch remains conductive;
generating the first control signal in order to render the first switch non-conductive to disconnect the correction node from the sense node; and
coupling, by applying a second control signal generated by the control circuit to render conductive the second switch, the correction node to a reset voltage and thereby correct the reset voltage level present at the sense node.

\* \* \* \* \*